(12) United States Patent
Avouris et al.

(10) Patent No.: US 9,210,835 B2
(45) Date of Patent: *Dec. 8, 2015

(54) GRAPHENE BASED STRUCTURES AND METHODS FOR SHIELDING ELECTROMAGNETIC RADIATION

(71) Applicant: INTERNATIONAL BUSINESS MACHINES CORPORATION, Armonk, NY (US)

(72) Inventors: Phaedon Avouris, Yorktown Heights, NY (US); Alberto V. Garcia, Hartsdale, NY (US); Chun-Yung Sung, Poughkeepsie, NY (US); Fengnian Xia, Plainsboro, NJ (US); Hugen Yan, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/668,095

(22) Filed: Mar. 25, 2015

(65) Prior Publication Data

US 2015/0201534 A1    Jul. 16, 2015

Related U.S. Application Data

(62) Division of application No. 13/523,178, filed on Jun. 14, 2012.

(51) Int. Cl.
*F21V 9/00* (2015.01)
*G02B 5/02* (2006.01)
(Continued)

(52) U.S. Cl.
CPC .................................. *H05K 9/0081* (2013.01)

(58) Field of Classification Search
USPC .......... 75/243; 252/582; 423/445, 447.2, 448, 423/460; 501/99; 524/496; 977/755, 773, 977/778, 783, 734, 843; 156/230, 235; 174/378, 389, 394; 427/249.1
See application file for complete search history.

(56) References Cited

U.S. PATENT DOCUMENTS

| 6,869,581 | B2 | 3/2005 | Kishi et al. |
| 7,015,142 | B2 | 3/2006 | DeHeer et al. |

(Continued)

FOREIGN PATENT DOCUMENTS

| CN | 101781459 A | 7/2010 |
| CN | 102502611 A1 | 6/2012 |

(Continued)

OTHER PUBLICATIONS

Ruitao Lv, Mauricio Terrones, Towards new graphene materials: Doped graphene sheets and nanoribbons, Materials Letters 78 (2012) 209-218, © 2012 Elsevier B.V. All rights reserved.*

(Continued)

*Primary Examiner* — Bijan Ahvazi
(74) *Attorney, Agent, or Firm* — Cantor Colburn LLP; Vazken Alexanian

(57) ABSTRACT

Electromagnetic interference shielding structures and methods of shielding an object form electromagnetic radiation at frequencies greater than a megahertz generally include providing highly doped graphene sheets about the object to be shielded. The highly doped graphene sheets may have a dopant concentration greater than $>1e10^{13}$ cm$^{-2}$, which is effective to reflect the electromagnetic radiation or a dopant concentration of $1e10^{13}$ cm$^{-2}>n>0$ cm$^{-2}$, which is effective to absorb the electromagnetic radiation.

4 Claims, 1 Drawing Sheet

(51) Int. Cl.
| | |
|---|---|
| G02C 7/10 | (2006.01) |
| G02F 1/361 | (2006.01) |
| G03B 1/00 | (2006.01) |
| H05K 9/00 | (2006.01) |
| C23C 16/00 | (2006.01) |

(56) References Cited

U.S. PATENT DOCUMENTS

| | | |
|---|---|---|
| 7,071,258 B1 | 7/2006 | Jang et al. |
| 8,268,180 B2 | 9/2012 | Arnold et al. |
| 8,414,964 B2 | 4/2013 | Ota et al. |
| 8,610,617 B1 | 12/2013 | Avouris et al. |
| 2007/0284557 A1 | 12/2007 | Gruner et al. |
| 2008/0023396 A1 | 1/2008 | Fugetsu |
| 2009/0011204 A1 | 1/2009 | Wang et al. |
| 2009/0017211 A1 | 1/2009 | Gruner et al. |
| 2009/0059474 A1 | 3/2009 | Zhamu et al. |
| 2009/0114890 A1 | 5/2009 | Imholt |
| 2009/0135042 A1 | 5/2009 | Umishita et al. |
| 2009/0146111 A1 | 6/2009 | Shin et al. |
| 2009/0155578 A1 | 6/2009 | Zhamu et al. |
| 2009/0174435 A1 | 7/2009 | Stan et al. |
| 2009/0305135 A1 | 12/2009 | Shi et al. |
| 2010/0028681 A1 | 2/2010 | Dai et al. |
| 2010/0096181 A1 | 4/2010 | Nakamura et al. |
| 2010/0215945 A1 | 8/2010 | Ota et al. |
| 2010/0279426 A1 | 11/2010 | Tour et al. |
| 2011/0108805 A1* | 5/2011 | Okai ............................ 257/26 |
| 2011/0108806 A1 | 5/2011 | Davidovic et al. |
| 2011/0163298 A1 | 7/2011 | Sung |
| 2011/0175060 A1* | 7/2011 | Okai et al. .................. 257/29 |
| 2011/0186818 A1 | 8/2011 | Bowers et al. |
| 2011/0210282 A1 | 9/2011 | Foley et al. |
| 2011/0210314 A1* | 9/2011 | Chung et al. ................ 257/29 |
| 2011/0240946 A1* | 10/2011 | Miao et al. .................. 257/3 |
| 2011/0250427 A1 | 10/2011 | Kotov et al. |
| 2011/0278545 A1* | 11/2011 | Voutilainen et al. ........... 257/29 |
| 2011/0300338 A1 | 12/2011 | Shin et al. |
| 2011/0303121 A1 | 12/2011 | Geim et al. |
| 2011/0320142 A1 | 12/2011 | Surman et al. |
| 2012/0001761 A1 | 1/2012 | Voutilainen et al. |
| 2012/0039344 A1 | 2/2012 | Kian et al. |
| 2012/0058350 A1 | 3/2012 | Long et al. |
| 2012/0064409 A1 | 3/2012 | Zhamu et al. |
| 2012/0068160 A1 | 3/2012 | Yamazaki et al. |
| 2012/0080086 A1 | 4/2012 | Yoon et al. |
| 2012/0170354 A1 | 7/2012 | Voutilainen et al. |
| 2012/0213994 A1 | 8/2012 | Jafry et al. |
| 2012/0265122 A1 | 10/2012 | El-Shall et al. |
| 2012/0288433 A1 | 11/2012 | Sutter et al. |
| 2012/0308884 A1 | 12/2012 | Oguni et al. |
| 2012/0325296 A1 | 12/2012 | Woo et al. |
| 2013/0001515 A1 | 1/2013 | Li et al. |
| 2013/0048952 A1 | 2/2013 | Chen et al. |
| 2013/0068521 A1 | 3/2013 | Hong et al. |
| 2013/0113081 A1 | 5/2013 | Chen et al. |
| 2013/0333937 A1* | 12/2013 | Avouris et al. ................ 174/378 |
| 2013/0335254 A1 | 12/2013 | Avouris et al. |
| 2013/0335255 A1 | 12/2013 | Avouris et al. |
| 2014/0004344 A1 | 1/2014 | Kim et al. |
| 2014/0011027 A1 | 1/2014 | Kim et al. |

FOREIGN PATENT DOCUMENTS

| | | |
|---|---|---|
| EP | 2409951 A1 | 1/2012 |
| ES | 2369953 A1 | 12/2011 |
| JP | 2012025652 A | 2/2012 |
| WO | 2008056123 A1 | 5/2008 |
| WO | 2010022353 A1 | 2/2010 |
| WO | 2011108878 A2 | 9/2011 |

OTHER PUBLICATIONS

Hugen Yan, Xuesong Li, Bhupesh Chandra, George Tulevski, Yanqing Wu, Marcus Freitag, Wenjuan Zhu, Phaedon Avouris and Fengnian Xia, Tunable infrared plasmonic devices using graphene/insulator stacks, Nature Nanotechnology | vol. 7 | May 2012 330, © 2012 Macmillan Publishers Limited. All rights reserved.*
Choi, H., et al. "Broadband Electromagnetic Response and Ultrafast Dynamics of Few-Layer Epitaxial Graphene", "Applied Physics Letters", vol. 94 (172102); Mar. 1, 2009, pp. 172102-1 through 172102-3.
De Bellis, G., et al.; "Electromagnetic Absorbing Nanocomposites including Carbon Fibers, Nanotubes and Graphene Nanoplatelets," Electromagnetic Compatibility (EMC), 2010 IEEE International Symposium, vol., No., pp. 202-207, Jul. 25-30, 2010.
Fugetsu, Bunshi. et al. "Graphene Oxide as Dyestuffs for the Creation of Electrically Conductive Fabrics", "Carbon", vol. 48 (12); Oct. 2010, pp. 1-27.
Hesjedal, Thorsten. et al. "Continuous Roll-to-Roll Growth of Graphene Films by Chemical Vapor Deposition", "Applied Physics Letters", vol. 98 (133106); Feb. 8, 2011, pp. 133106-1 through 133106-3.
Kim, Keun Soo. et al. "Large-Scale Pattern Growth of Graphene Films for Stretchable Transparent Electrodes", "Nature", vol. 457; Feb. 16, 2009, pp. 706-710.
Lee, Chul. et al. "Optical Response of Large Scale Single Layer Graphene", Applied Physics Letters, vol. 98 (071905); Aug. 26, 2011, pp. 071905-1 through 071905-3.
Li, Xuesong. et al. "Large-Area Synthesis of High-Quality and Uniform Graphene Films on Copper Foils", Science, vol. 324; Jun. 5, 2009, pp. 1312-1314.
Liu, Jianwei. et al. "Doped Graphene Nanohole Arrays for Flexible Transparent Conductors", "Applied Physics Letters", vol. 99 (023111); Mar. 31, 2011, pp. 023111-1 through 023111-3.
Ludwig, Alon. et al. "ODark Materials Based on Graphene Sheet Stacks", Optics Letters, vol. 36, No. 2; Jan. 15, 2011, pp. 106-107.
Lv et al; Towards new graphene materials: Doped graphene sheets and nanoribbons, Materials Letters, 78 (2012), 209-218.
Lv, Ruitao. et al. "Carbon Nanotubes Filled with Ferromagnetic Alloy Nanowires: Lightweight and Wide-Band Microwave Absorber", Applied Physics Letters, vol. 93 (223105); Jul. 19, 2008, pp. 223105-1 through 223105-3.
Sekine, T., et al.; "Transparent and Double-Sided Wave Absorber with Specified Reflection and Transmission Coefficients," Electromagnetic Compatibility—EMC Europe, 2009 International Symposium, vol., No., pp. 1-3, Jun. 11-12, 2009.
Tennant, A.; Chambers, B.; "Phase switched radar absorbers," Antennas and Propagation Society International Symposium, 2001. IEEE, vol. 4, No., pp. 340-343 vol. 4, 2001.
Yan, et al; Tunable infrared plasmononic devices suing graphene/insulator stacks. Nature Nanotechnology. vol. 7, May 2012—330.
Yan,e t al; Infrared Spectroscopy of Tunable Dirac Terahertz Magneto-Plasmons in Graphene, Nano Lett. 2012, 12, 3766-3771.
Yu, H., et al.; (Abstract), Graphene/Polyaniline Nanorod Arrays: Synthesis and Excellent Electromagnetic absorption properties. Journal of Materials Chemistry, 2012; 22(40), 21679-21685.
Zhang, X.F.. et al. "Microwave Absorption Properties of the Carbon-Coated Nickel Nanocapsules", Applied Physics Letters, vol. 89 (053115); May 9, 2006, pp. 053115-1 through 053115-2.
Office Action issued in German Application No. 10 2013210162.7, dated Jul. 7, 2015; 6 pages.

* cited by examiner

GRAPHENE BASED STRUCTURES AND METHODS FOR SHIELDING ELECTROMAGNETIC RADIATION

DOMESTIC PRIORITY

The present application is a DIVISIONAL of U.S. application Ser. No. 13/523,178, filed on Jun. 14, 2012, the contents of which are incorporated herein by reference in its entirety.

BACKGROUND

The present disclosure generally relates to structures and methods for shielding electromagnetic waves using graphene, and more particularly, to methods and structures of doped graphene sheets configured to reflect and/or absorb the electromagnetic waves being emitted from a electromagnetic wave generating source depending on the amount of dopant therein.

Emission of electromagnetic (EM) radiation at radio, microwave and terahertz frequencies is known to interfere with operation of electronic devices and has been linked to various health hazards to exposed individuals. For example, the World Health Organization has recently announced that exposure to microwave radiation could increase the risk of brain cancer. Because of concerns such as these, EM radiation is a serious issue and attempts to provide various shielding materials and devices have evolved. Most commonly used EM shields in use today are fabricated from metallic films, metallic grids, metallic foams, or powders on glass or plastic substrates. One example is a shielded cable, which has electromagnetic shielding in the form of a wire mesh surrounding an inner core conductor. The shielding impedes the escape of any signal from the core conductor, and also signals from being added to the core conductor. Some cables have two separate coaxial screens, one connected at both ends, the other at one end only, to maximize shielding of both electromagnetic and electrostatic fields. Another example is the door of a microwave oven, which typically has a metallic screen built into the window. From the perspective of microwaves (with wavelengths of 12 cm) this screen in combination with the oven's metal housing provides a Faraday cage. Visible light, with wavelengths ranging between 400 nm and 700 nm, passes easily between the openings the metallic screen whereas microwaves are contained within the oven itself.

Due to the inherent weight of metallic shields, the added weight can be significant. Moreover, many of the currently available EM shields are not transparent, which can be a significant disadvantage for many applications. Conventional transparent and conductive materials such as indium tin oxide (ITO) and zinc oxide (ZnO) have been applied to transparent substrates such as glass and plastics for EM shielding. However, the use of these types of transparent EM shields is fairly limited in their use because the shielding effectiveness of these materials is generally low, the shield itself is typically inflexible, and these types of EM shields provide limited mechanical strength. Providing higher EM effectiveness with these types of materials requires increased thicknesses, which then affect transparency.

It therefore would be useful to provide methods and structures for substantially shielding electronic devices, wherein the structures are relatively light, can be provided and incorporated into devices at relatively low cost while adding little weight to the device, and are corrosion resistant.

SUMMARY

According to an embodiment, an electromagnetic interference shielding structure for shielding electromagnetic radiation emitted from a source at frequencies greater than one megahertz comprises one or more graphene sheets, wherein at least one of the graphene sheets is doped with a dopant having a dopant concentration in an amount effective to reflect electromagnetic radiation at frequencies greater than 1 megahertz.

In another embodiment, an electromagnetic interference shielding structure for shielding electromagnetic radiation emitted from a source at frequencies greater than one megahertz comprises one or more graphene sheets, wherein at least one of the graphene sheets is doped with a dopant having a dopant concentration in an amount effective to absorb electromagnetic radiation at frequencies greater than 1 megahertz.

In another embodiment, an electromagnetic interference shielding structure for shielding electromagnetic radiation at frequencies greater than one megahertz comprises one or more graphene sheets, wherein at least one of the one or more graphene sheets comprises a dopant having a dopant concentration effective to reflect and/or absorb electromagnetic radiation at frequencies greater than 1 megahertz; and a flexible substrate, wherein the one of more graphene sheets are disposed on the flexible substrate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
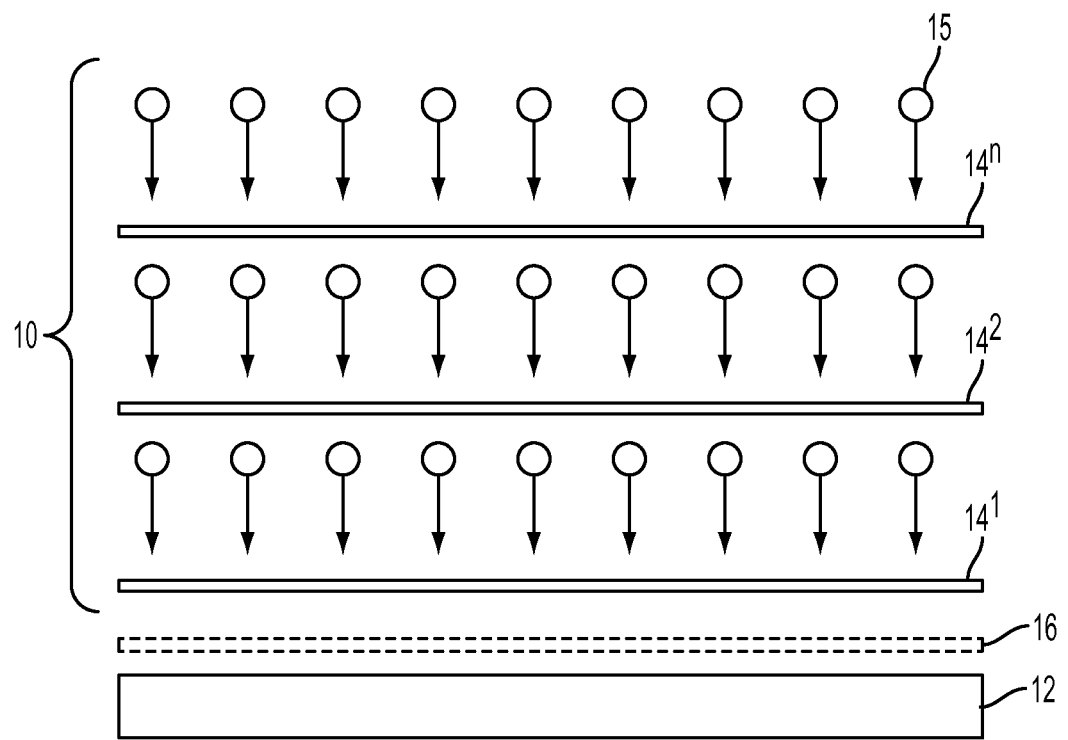
FIG. 1 illustrates electromagnetic shielding structure for an object to be shielded from electromagnetic radiation, the structure including individually doped graphene sheets according to an embodiment.

Disclosed herein are electromagnetic shielding structures and methods for shielding electromagnetic radiation emitted from an electromagnetic radiation source. The electromagnetic shield structures are generally formed from one or more sheets of doped graphene.

Graphene is a two dimensional allotrope of carbon atoms arranged in a planar, hexagonal structure. It features useful electronic properties including bipolarity, high purity, high mobility, and high critical current density. Electron mobility values as high as 200,000 $cm^2/Vs$ at room temperature have been reported.

Structurally, graphene has hybrid orbitals formed by sp2 hybridization. In the sp2 hybridization, the 2s orbital and two of the three 2p orbitals mix to form three sp2 orbitals. The one remaining p-orbital forms a pi-bond between the carbon atoms. Similar to the structure of benzene, the structure of graphene has a conjugated ring of the p-orbitals which exhibits a stabilization that is stronger than would be expected by the stabilization of conjugation alone, i.e., the grapheme structure is aromatic. Unlike other allotropes of carbon such as diamond, amorphous carbon, carbon nanofoam, or fullerenes, graphene is not an allotrope of carbon since the thickness of graphene is one atomic carbon layer i.e., a sheet of graphene does not form a three dimensional crystal. However, multiple sheets of graphene may be stacked. A typical graphene "layer" may comprise a single sheet or multiple sheets of graphene, for example, between 1 sheet and 10 sheets.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions having an effective mass of zero and moving at the effective speed of light of ceJf£106 msec. Their relativistic quantum mechanical behavior is governed by Dirac's equation. As a consequence, graphene sheets have a large carrier mobility of up to 60,000 cm2/V-sec at 4 K. At 300 K, the carrier mobility is about 15,000 cm2/V-sec. Also, quantum Hall effect has been observed in graphene sheets.

By doping the graphene sheets, higher carrier absorption can be obtained as well has higher transparency in the near infrared and visible wavelength ranges due to Pauili blocking.

Advantageously, the electromagnetic shield structures according to the present disclosure provide effective shielding by reflection and/or absorption at a frequency range of about 1 megahertz to about a few hundred gigahertz, which is a significant improvement over prior electromagnetic shielding materials. Moreover, because graphene is a one atom thick monolayer sheet formed of carbon atoms packed in a honeycomb crystalline lattice, wherein each carbon atom is bonded to three adjacent carbon atoms via $sp^2$ bonding, the overall thickness required to provide >40 decibel (dB) shielding effectiveness, for example, is on the order of a few nanometers. Still further, shielding effectiveness is increased by doping the graphene sheets. As such, the use of doped graphene sheet(s) provides minimal added weight to the object to be shielded, has broadband capabilities, and provides greater versatility as a function of its doping. Moreover, graphene is generally recognized for its high mechanical strength and high stability. In contrast, prior electromagnetic shield materials require an increased thickness to increase shielding effectiveness. In the present disclosure, increasing the level of doping for a given thickness of stacked graphite sheets provides increased shield effectiveness.

The graphene sheets can be made by any suitable process known in the art. For example, graphene can be formed by solid state graphitization, i.e., by sublimating silicon atoms from a surface of silicon carbide surface such as a (001) surface. At about 1,150° C., a complex pattern of a surface reconstruction begins to appear at an initial stage of graphitization. Typically, a higher temperature is needed to form a graphene layer.

Formation of a graphene layer on another material is known in the art. For example, single or several layers of graphene may be formed one a silicon carbide substrate by sublimation decomposition of a surface layer of a silicon carbide material.

U.S. Pat. No. 7,071,258 to Jang et al. and U.S. Pat. No. 6,869,581 to Kishi et al. describe known properties and methods of forming graphene layers, the contents of which are incorporated by reference. Further U.S. Pat. Application Publication No. 2006/00099750 to DeHeer et al. and U.S. Pat. No. 7,015,142 to DeHeer et al. describe methods of forming graphene layer, the contents of which are incorporated by reference.

The graphene can be formed on a substrate as may be desired in some applications. The particular substrate is not intended to be limited and may even include the electromagnetic radiation source itself. In one embodiment, the substrate is transparent. In other embodiments, the substrate is flexible. In still other embodiments, the substrate is both flexible and transparent. Likewise, the shape of the substrate is not intended to be limited. For example, the substrate may have planar and/or curvilinear surfaces such as may be found in foils, plates, tubes, and the like. Moreover, the substrate material is not intended to be limited. Suitable materials include plastics, metals, and the like.

By way of example only, chemical vapor deposition (CVD) onto a metal (i.e., foil) substrate can be used to form the graphene sheets. See, for example, Li et al., "Large-Area Synthesis of High-Quality and Uniform Graphene Films on Copper Foils," Science, 324, pgs. 1312-1314 (2009) (hereinafter "Li") and Kim et al., "Large-Scale Pattern Growth of Graphene Films for Stretchable Transparent Electrodes," Nature, vol. 457, pgs. 706-710 (2009) (hereinafter "Kim"), the contents of each of which are incorporated by reference herein. Chemical exfoliation may also be used to form the graphene sheets. These techniques are known to those of skill in the art and thus are not described further herein. The as-prepared graphene sheets typically have a sheet resistance of from about 250 ohms per square (ohm/sq) to about 4,000 ohm/sq, depending on the fabrication process.

Once the graphene sheets are formed, the sheets are deposited onto a substrate using conventional lift-off techniques. In general, the sheets are deposited one on top of another to form the film. Thus, by way of example only, the graphene film can comprise a stack of multiple graphene sheets (also called layers). The term "substrate" is used to generally refer to any suitable substrate on which one would want to deposit a graphene film. By way of example only, the substrate can be an object to be shielded or may be a flexible film, which may optionally be transparent. The flexible film may then be applied to the object to be shielded.

The step of combining the doped graphene film with one or more structural materials to form a composite material can be done using a variety of techniques known in the art that suitably preserve the integrity of the graphene film. A wide variety of structural materials are envisioned for use in the construction of the composite material. In one embodiment, the structural materials may include essentially any low conductive substrate or structure. For example, the structural material may include foams, honeycombs, glass fiber laminates, Kevlar fiber composites, polymeric materials, or combinations thereof. Non-limiting examples of suitable structural materials include polyurethanes, silicones, fluorosilicones, polycarbonates, ethylene vinyl acetates, acrylonitrile-butadiene-styrenes, polysulfones, acrylics, polyvinyl chlorides, polyphenylene ethers, polystyrenes, polyamides, nylons, polyolefins, poly(ether ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes, styrene-butadiene-styrenes, ethylene-propylenes, ethylene-propylene-diene monomers (EPDM), nitrile-butadienes, and styrene-butadienes (SBR), and copolymers and blends thereof. Any of the forgoing materials may be used unfoamed or, if required by the application, blown or otherwise chemically or physically processed into open or closed cell foam.

Likewise, the graphene films as described herein can be disposed directly onto the device to be protected electromagnetic radiation so as to encapsulate and/or enclose the device. The device may be virtually any device that includes an electronic circuit, non-limiting examples of which include computers, mobile and landline telephones, televisions, radios, personal digital assistants, digital music players, medical instruments, automotive vehicles, aircraft, and satellites.

It should be apparent that using no more than routine experimentation, one skilled in the art can select structural materials for use with the graphene film, based on properties such as operating temperature, hardness, chemical compatibility, resiliency, compliancy, compression-deflection, compression set, flexibility, ability to recover after deformation, modulus, tensile strength, elongation, force defection, flammability, or any other chemical or physical property.

In one embodiment shown in FIG. 1, the electromagnetic shield structure 10 for shielding an object 12 from electromagnetic radiation includes one or more graphene sheets $14^1$, $14^2$, . . . $14^n$ are transferred to the object to be shielded. Each individual graphene sheet is doped with a dopant 15 to enhance shielding effectiveness and transparency in the visible range. In one embodiment, the graphene sheet is doped with a p-dopant such that electrons flow out of the graphene, thereby increasing the work function of the graphene layer. Optionally, the one or more graphene sheets are transferred to a flexible substrate 16. In one embodiment, the flexible substrate is transparent to radiation in the visible wavelength range.

The number of graphene sheets utilized will vary depending on the intended application. For example, the graphene can be used as a single layer or in a multilayer configuration as described above. As such, the graphene layer can have a thickness of about 1 nanometer to about 100 nanometers, a thickness of about 10 nm to about 80 nm in other embodiments, and a thickness of up to about 100 nm in still other embodiments.

Figure 2:
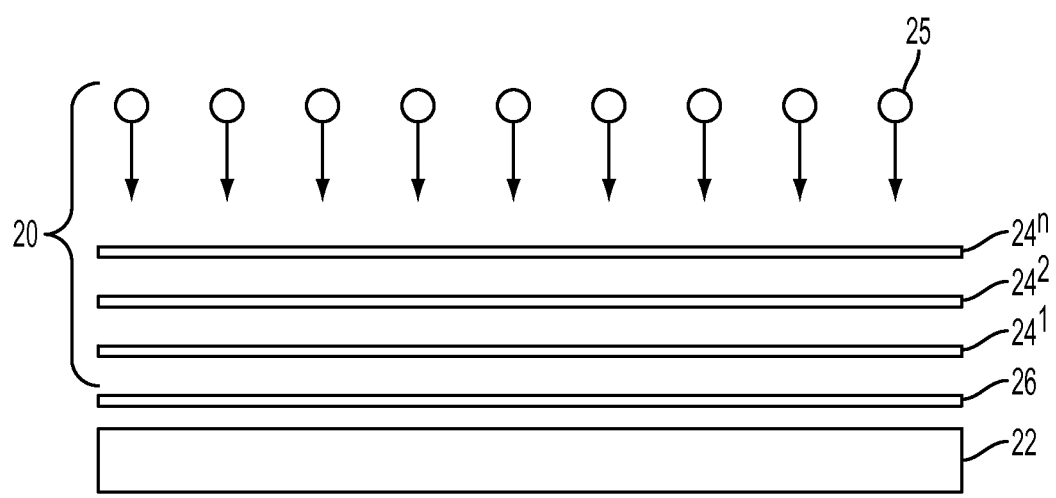
FIG. 2 illustrates electromagnetic shielding structure for an object to be shielded from electromagnetic radiation, the structure including a doped uppermost graphene sheet according to an embodiment.

In another embodiment shown in FIG. 2, the electromagnetic shield structure 20 for shielding an object 22 from electromagnetic radiation includes one or more graphene sheets $24^1$, $24^2$, . . . $24^n$ are transferred to the object to be shielded. Doping is performed on the transferred sheets with a dopant 25 after all of the graphene sheets have been transferred, i.e., doping is performed on the stack. Optionally, the one or more graphene sheets are transferred to a flexible substrate 6. In one embodiment, the flexible substrate is transparent to radiation in the visible wavelength range. The number of graphene sheets utilized will vary depending on the intended application.

As discussed above, the graphene film is doped. As used herein, the term doped refers to an amount of dopant used to effect a doping concentration (n) in the graphene sheet that is reflective. By way of example, the dopant concentration (n) is highly doped to effect reflection and is greater than $1e10^{13}$ $cm^{-2}$. In other embodiments, the dopant concentration is effective to absorb the electromagnetic radiation. By way of example, the dopant concentration (n) is moderately doped at $1e1013$ $cm^{-2} > n > 1e10^{12}$ $cm^{-2}$. In other embodiments, the dopant concentration (n) is low doped at $1e10^{12}$ $cm^{-2} > n > 0$ $cm^{-2}$.

The dopants may be applied as a solution and/or as a vapor. By way of example, the graphene sheets are added to a solution of the dopant at temperatures of about room temperature to about 120° C. with agitation for about an hour to several days. At the end of this process, the graphene sheets are now highly doped. The residual doping agents are removed via separation technologies (filtration wash, centrifugation, cross-flow filtration).

Examples of suitable dopants for increasing shielding effectiveness include oxidizing dopant such as, without limitation, hydrobromic acid, hydroiodic acid, nitric acid, sulfuric acid, oleum, hydrochloric acid, citric acid, oxalic acid, or metal salts, examples of which include, but not limited to, gold chloride, silver nitrate, and the like. Exposing the graphene film to the dopant solution and/or vapor shifts the graphene Fermi level further away from the Dirac point, leading to a large increase in the conductivity and reduction of the sheet resistance without interrupting the conjugated network of the graphene sheet.

The shield effectiveness (SE) in dB is expressed by the following equations: $SE=20 \log(Ei/Et)$; $SE=10 \log (Pi/Pt)$, wherein E is the field strength in V/m, P is the field strength in $W/m^2$, i is the incident wave field, and t is the conduction field. In the present disclosure, the shielding effectiveness (SE) of the electromagnetic interference shielding structure according to the present disclosure is at least 30 dB or more, and in other embodiments greater than 40 dB or more, when the frequency of the electromagnetic waves is greater than 1 MHz.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," are intended to be open, non-limiting terms, unless the contrary is expressly indicated and when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An electromagnetic interference shielding structure for shielding electromagnetic radiation emitted from a source at frequencies greater than one megahertz comprising, in combination:

the source comprising an electronic circuit configured to emit electromagnetic radiation at radio, microwave and terahertz frequencies;

one or more graphene sheets disposed directly on a device to be protected from the electromagnetic radiation, wherein at least one of the graphene sheets is doped with a dopant having a dopant concentration in an amount effective to absorb electromagnetic radiation at frequencies greater than 1 megahertz, wherein the device includes an electronic circuit, wherein the one or more graphene sheets stackedly arranged and in direct contact with one another, and not a component of the electronic circuit, and wherein the dopant concentration (n) is greater than $1e10^{13}$ cm$^{-2}$>n>$1e10^{12}$ cm$^{-2}$ or $1e10^{12}$ cm$^{-2}$>n>0 cm$^{-2}$.

2. The electromagnetic interference shielding structure of claim 1, wherein the dopant comprises an acid selected from the group consisting of hydrobromic acid, hydroiodic acid, nitric acid, sulfuric acid, oleum, hydrochloric acid, citric acid, and oxalic acid, or a metal salt selected from the group consisting of gold chloride and silver nitrate.

3. The electromagnetic interference shielding structure of claim 1, wherein the one or more graphene sheets are configured to provide a shielding effectiveness greater than 40 dB.

4. The electromagnetic interference shielding structure of claim 1, wherein the flexible substrate and the one or more doped graphene sheets are transparent to visible radiation.

\* \* \* \* \*